United States Patent
Zuolo et al.

(10) Patent No.: US 11,514,992 B2
(45) Date of Patent: Nov. 29, 2022

(54) METHOD AND APPARATUS FOR READING A FLASH MEMORY DEVICE

(71) Applicant: Microchip Technology Inc., Chandler, AZ (US)

(72) Inventors: Lorenzo Zuolo, Lusia (IT); Rino Micheloni, Turate (IT)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 17/234,993

(22) Filed: Apr. 20, 2021

(65) Prior Publication Data

US 2022/0270698 A1 Aug. 25, 2022

Related U.S. Application Data (60) Provisional application No. 63/153,906, filed on Feb. 25, 2021.

(51) Int. Cl.
*G11C 16/34* (2006.01)
*G06N 5/04* (2006.01)
(Continued)

(52) U.S. Cl.
CPC ....... *G11C 16/3495* (2013.01); *G06N 3/0454* (2013.01); *G06N 3/063* (2013.01);
(Continued)

(58) Field of Classification Search
CPC ... G11C 16/3495; G11C 16/08; G11C 16/102; G11C 16/14; G11C 16/26; G11C 16/3404; G06N 3/0454; G06N 3/063; G06N 5/04
See application file for complete search history.

(56) References Cited

U.S. PATENT DOCUMENTS

| 6,567,313 B2 | 5/2003 | Tanaka et al. |
| 6,704,871 B1 | 3/2004 | Kaplan et al. |

(Continued)

FOREIGN PATENT DOCUMENTS

WO 2020117348 A3 12/2020

OTHER PUBLICATIONS

PCT/US2021/030191, International Search Report and Written Opinion, European Patent Office, dated Nov. 3, 2021.
(Continued)

*Primary Examiner* — Ajay Ojha
(74) *Attorney, Agent, or Firm* — Glass and Associates; Kenneth Glass (57) ABSTRACT

A method for reading a flash memory device includes storing configuration files of reliability-state Classification Neural Network (CNN) models and Regression Neural Network (RNN) inference models, and storing reliability-state tags corresponding to reliability states. The current number of P/E cycles is identified and a reliability-state CNN model is selected corresponding to the current number of P/E cycles. A neural network operation of the selected reliability-state CNN model is performed to identify a predicted reliability state. Corresponding reliability-state tags are identified and a corresponding RNN inference model is selected. A neural network operation of the selected RNN inference model is performed, using the reliability-state tags as input, to generate output indicating the shape of a threshold-voltage-shift read-error (TVS-RE) curve. Threshold Voltage Shift Offset (TVSO) values are identified corresponding to a minimum value of the TVS-RE curve and a read is performed using a threshold-voltage-shift read at the identified TVSO values.

17 Claims, 5 Drawing Sheets

(51) Int. Cl.
*G11C 16/26* (2006.01)
*G11C 16/10* (2006.01)
*G11C 16/14* (2006.01)
*G11C 16/08* (2006.01)
*G06N 3/04* (2006.01)
*G06N 3/063* (2006.01)

(52) U.S. Cl.
CPC .............. *G06N 5/04* (2013.01); *G11C 16/08* (2013.01); *G11C 16/102* (2013.01); *G11C 16/14* (2013.01); *G11C 16/26* (2013.01); *G11C 16/3404* (2013.01)

(56) References Cited

U.S. PATENT DOCUMENTS

| | | | |
|---|---|---|---|
| 7,529,215 B2 | 5/2009 | Osterling et al. |
| 7,650,480 B2 | 1/2010 | Jiang |
| 7,930,623 B2 | 4/2011 | Pisek et al. |
| 8,429,325 B1 | 4/2013 | Onufryk et al. |
| 8,621,318 B1 | 12/2013 | Micheloni et al. |
| 8,656,257 B1 | 2/2014 | Micheloni et al. |
| 8,665,648 B2 | 3/2014 | Mun et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,966,335 B2 | 2/2015 | Lunelli et al. |
| 8,971,112 B2 | 3/2015 | Crippa et al. |
| 8,990,661 B1 | 3/2015 | Micheloni et al. |
| 9,092,353 B1 | 7/2015 | Micheloni et al. |
| 9,128,858 B1 | 9/2015 | Micheloni et al. |
| 9,235,467 B2 | 1/2016 | Micheloni et al. |
| 9,251,909 B1 | 2/2016 | Camp et al. |
| 9,268,531 B1 | 2/2016 | Woo et al. |
| 9,292,428 B2 | 3/2016 | Kanamori et al. |
| 9,305,661 B2 | 4/2016 | Micheloni et al. |
| 9,397,701 B1 | 7/2016 | Micheloni et al. |
| 9,417,804 B2 | 8/2016 | Micheloni et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,590,656 B2 | 3/2017 | Micheloni et al. |
| 9,747,200 B1 | 8/2017 | Micheloni |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,216,422 B2 | 2/2019 | Kim et al. |
| 10,230,396 B1 | 3/2019 | Micheloni et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,490,288 B1 | 11/2019 | Wang et al. |
| 10,861,562 B1 * | 12/2020 | Xiong ...................... G06N 3/08 |
| 11,398,291 B2 | 7/2022 | Zuolo et al. |
| 2006/0106743 A1 | 5/2006 | Horvitz |
| 2006/0282603 A1 | 12/2006 | Onufryk et al. |
| 2007/0076873 A1 | 4/2007 | Yamamoto et al. |
| 2011/0255453 A1 | 10/2011 | Roh et al. |
| 2012/0166714 A1 | 6/2012 | Mun et al. |
| 2012/0287719 A1 | 11/2012 | Mun et al. |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0033037 A1 | 1/2015 | Lidman |
| 2015/0049548 A1 | 2/2015 | Park et al. |
| 2016/0072527 A1 | 3/2016 | Suzuki et al. |
| 2016/0247581 A1 | 8/2016 | Suzuki et al. |
| 2016/0266791 A1 | 9/2016 | Lin et al. |
| 2017/0133107 A1 | 5/2017 | Ryan et al. |
| 2017/0213597 A1 | 7/2017 | Micheloni |
| 2018/0033490 A1 | 2/2018 | Marelli et al. |
| 2019/0004734 A1 | 1/2019 | Kirshenbaum et al. |
| 2019/0087119 A1 | 3/2019 | Oh et al. |
| 2019/0095794 A1 | 3/2019 | López et al. |
| 2019/0317901 A1 | 10/2019 | Kachare et al. |
| 2020/0004455 A1 | 1/2020 | Williams et al. |
| 2020/0066361 A1 | 2/2020 | Ioannou et al. |
| 2020/0074269 A1 | 3/2020 | Trygg et al. |
| 2020/0125955 A1 | 4/2020 | Klinger et al. |
| 2020/0151539 A1 | 5/2020 | Oh et al. |
| 2020/0185027 A1 * | 6/2020 | Rom ................... G11C 11/5628 |
| 2020/0210831 A1 | 7/2020 | Zhang et al. |
| 2021/0192333 A1 | 6/2021 | Thiruvengadam et al. |
| 2022/0051730 A1 | 2/2022 | Choi et al. |
| 2022/0188604 A1 | 6/2022 | Zuolo et al. |

OTHER PUBLICATIONS

U.S. Appl. No. 17/089,891, filed Nov. 5, 2020, Lorenzo Zuolo.
U.S. Appl. No. 17/148,200, filed Jan. 13, 2021, Lorenzo Zuolo.
U.S. Appl. No. 17/213,675, filed Mar. 26, 2021, Lorenzo Zuolo.
U.S. Appl. No. 17/385,857, filed Jul. 26, 2021, Lorenzo Zuolo.
U.S. Appl. No. 63/057,278, filed Jul. 27, 2021, Lorenzo Zuolo.
Noam Shazeer et al: Outrageously Large Neural Networks: The Sparsely-Gated Mixture-of-Experts Layer11 , arxiv .org, Cornell University Li Bra Ry, 201 Olin Li Bra Ry Cornell University Ithaca, NY 14853, Jan. 23, 2017.
Yu Cai et al, "Errors in Flash-Memory-Based Solid-State Drives: Analysis, Mitigation, and Recovery" 11 , arxiv.org, Cornell University Library, 201 Olin Library Cornell University Ithaca, NY 14853, Nov. 28, 2017.
U.S. Appl. No. 17/234,993, filed Apr. 20, 2021, Lorenzo Zuolo.
U.S. Appl. No. 17/347,388, filed Jun. 14, 2021, Lorenzo Zuolo.
U.S. Appl. No. 17/398,091, filed Aug. 10, 2021, Lorenzo Zuolo.
U.S. Appl. No. 17/506,735, filed Oct. 21, 2021, Lorenzo Zuolo.
Anonymous, "Training checkpoints | TensorFlow Core", Dec. 28, 2019, XP055886114, p. 1-p. 8, Retrieved from the Internet.

* cited by examiner

METHOD AND APPARATUS FOR READING A FLASH MEMORY DEVICE

CROSS-REFERENCE TO RELATED APPLICATIONS

The present application claims priority to U.S. Provisional Patent Application Ser. No. 63/153,906 filed on Feb. 25, 2021, the contents of which are incorporated by reference herein in their entirety.

BACKGROUND OF THE INVENTION

Some Solid State Drives (SSD's) include flash controllers that use threshold-voltage-shift reads for reading flash memory devices to obtain low levels of Uncorrectable Bit Error Rate (UBER) required for client and enterprise SSD's. Threshold-voltage-shift reads are performed by sending a threshold-voltage-shift read instruction to a flash memory device that is to be read. One or more Threshold-Voltage-Shift Offset (TVSO) value is sent with the threshold-voltage-shift read instruction. The TVSO value indicates the amount by which each threshold voltage that is used to perform the read is to be offset from a corresponding default threshold voltage that is specified by the manufacturer of the flash memory device. Multi-level cell (MLC) flash memory devices store two bits of information in each cell and require three TVSO values for each read; triple level cell (TLC) flash memory devices store three bits of information in each cell and require seven TVSO values for each read; quad level cell (QLC) flash memory devices store four bits of information in each cell and require 15 TVSO values for each read; and penta level cell (PLC) flash memory devices store five bits of information in each cell and require 31 TVSO values for each read.

A flash characterization testing process is performed to identify the best TVSO values to use in performing reads of a particular flash memory device, commonly referred to as Threshold-Voltage-Shift-Offset-minimum (TVSOmin) values. TVSOmin values are usually a set of TVSO values that produce the least errors when reading the flash memory device at testing conditions corresponding to a particular reliability state. Reliability-states are sets of conditions that indicate the age and usage of individual flash memory devices. There are many different processes for determining TVSOmin values and in many instances the sets of TVSOmin values identified during flash characterization testing are not the actual TVSO values that produce the least errors, but rather they are sets of TVSO values that meet one or more performance metric such as, for example, a particular Raw Bit Error Rate (RBER).

Flash controllers that use threshold voltage shift read instructions for performing reads typically include firmware for monitoring physical characteristics of the flash memory devices and use the monitored physical characteristics for determining the TVSO values to use in performing reads of each flash memory device. The TVSO values to be used for performing the read (referred to hereinafter as "TVSO Read-Current" values or TVSO-RC values) are typically determined prior to each read by the flash controller based on the physical location to be read (e.g., block/page) and the current physical characteristics of the flash memory device to be read as measured by the flash controller, by performing a look-up operation in a look-up table using the physical location to be read and the current physical characteristics of the flash memory device (e.g., number of program/erase cycles, retention time, number of read disturbs and temperature). The TVSO-RC values are usually one of the sets of TVSOmin values identified in flash characterization testing.

The current physical characteristics must be maintained to assure that the correct TVSO value is being used to read each flash memory device, even during a power-down state. In addition, complex tables are required that indicate the various physical characteristics and corresponding TVSO-RC values to use for performing reads. These complex tables also take up a significant amount of storage.

There is therefore a need to identify TVSO values to be used in each read of a flash memory device so as to maintain LIBER within acceptable levels during the lifetime of the SSD that reduces the amount of required storage and maintenance of physical characteristics.

SUMMARY OF THE INVENTION

A method for reading a flash memory device includes storing configuration files of a plurality of reliability-state Classification Neural Network (CNN) models, configuration files of a plurality of Regression Neural Network (RNN) inference models and a plurality of sets of reliability-state tags. Each set of reliability-state tags are associated with one of a plurality of reliability states and each of the reliability-state CNN models is associated with a range of program and erase (P/E) cycles. The operation of the flash memory device is monitored to identify a current number of program and erase (P/E) cycles of the flash memory device. The one of the reliability-state CNN models associated with a range of P/E cycles corresponding to the current number of P/E cycles is selected and a neural network operation of the selected reliability-state CNN model is performed to identify a predicted reliability state. The set of reliability-state tags associated with the predicted reliability state are identified. The one of the plurality of RNN inference models that corresponds to the predicted reliability state is selected, and a neural network operation of the selected RNN inference model that uses as input the identified reliability-state tags is performed to generate output values indicating the shape of a threshold-voltage-shift read-error (TVS-RE) curve. A Threshold Voltage Shift Offset (TVSO) value proximate to a minimum value of the generated TVS-RE curve are identified and a read of the flash memory device is performed using a threshold-voltage-shift read at the identified TVSO value(s).

A flash controller is disclosed that includes a data storage module configured for storing configuration files of a plurality of reliability-state CNN models, configuration files of at least one RNN inference model and a plurality of sets of reliability-state tags, each set of reliability-state tags associated with one of a plurality of reliability states and each of the reliability-state CNN models associated with a range of program and erase (P/E) cycles. A status module is configured to identify a current number of program and erase cycles. A neural processing module is coupled to the data storage module and to the control module. The neural processing module is configured to perform a neural network operation of the one of the stored reliability-state CNN models associated with a range of P/E cycles corresponding to the current number of P/E cycles to identify a predicted reliability state, and perform neural network operations of the RNN inference models corresponding to the predicted reliability state, using as input to each neural network operation the set of reliability-state tags associated with the predicted reliability state, to generate output indicating the shape of TVS-RE curves for all threshold voltage regions required to read the flash memory device. A minimum function module is configured to identify TVSO values for all threshold voltage regions required to read the flash memory device, each of the identified TVSO values proximate a minimum value of one of the TVS-RE curves. A read module is configured to perform a read of the flash memory device by sending a threshold-voltage-shift read instruction to the flash memory device that includes the identified TVSO values.

A Solid State Drive (SSD) is disclosed that includes a flash memory device and a flash controller coupled to the flash memory device. The flash controller includes a data storage module configured for storing configuration files of a plurality of reliability-state Classification Neural Network (CNN) models, configuration files of a plurality of Regression Neural Network (RNN) inference models and a plurality of sets of reliability-state tags, each set of reliability-state tags associated with one of a plurality of reliability states and each of the reliability-state CNN models associated with a range of program and erase (P/E) cycles. A neural processing module is coupled to the data storage module and to the control module. The neural processing module is configured to perform a neural network operation of the stored reliability-state CNN model associated with a range of P/E cycles corresponding to the current number of P/E cycles to identify a predicted reliability state, and perform neural network operations of the RNN inference models corresponding to the predicted reliability state, using as input to each neural network operation the set of reliability-state tags associated with the predicted reliability state, to generate output indicating the shape of TVS-RE curves for all threshold voltage regions required to read the flash memory device. The flash controller includes a status module configured to identify a current number of program and erase (P/E) cycles. The flash controller includes a neural processing module coupled to the data storage module and to the control module. The flash controller includes a minimum function module configured to identify TVSO values for all threshold voltage regions required to read the flash memory device, each of the identified TVSO values proximate a minimum value of one of the TVS-RE curves, and a read module configured to perform a read of the flash memory device by sending a threshold-voltage-shift read instruction to the flash memory device that includes the identified TVSO values.

BRIEF DESCRIPTION OF THE DRAWINGS

The accompanying drawings are included to provide a further understanding of the invention, and are incorporated in, and constitute a part of, this specification. The drawings illustrate various embodiments. The drawings referred to in this brief description should not be understood as being drawn to scale unless specifically noted.

DETAILED DESCRIPTION

Figure 1:
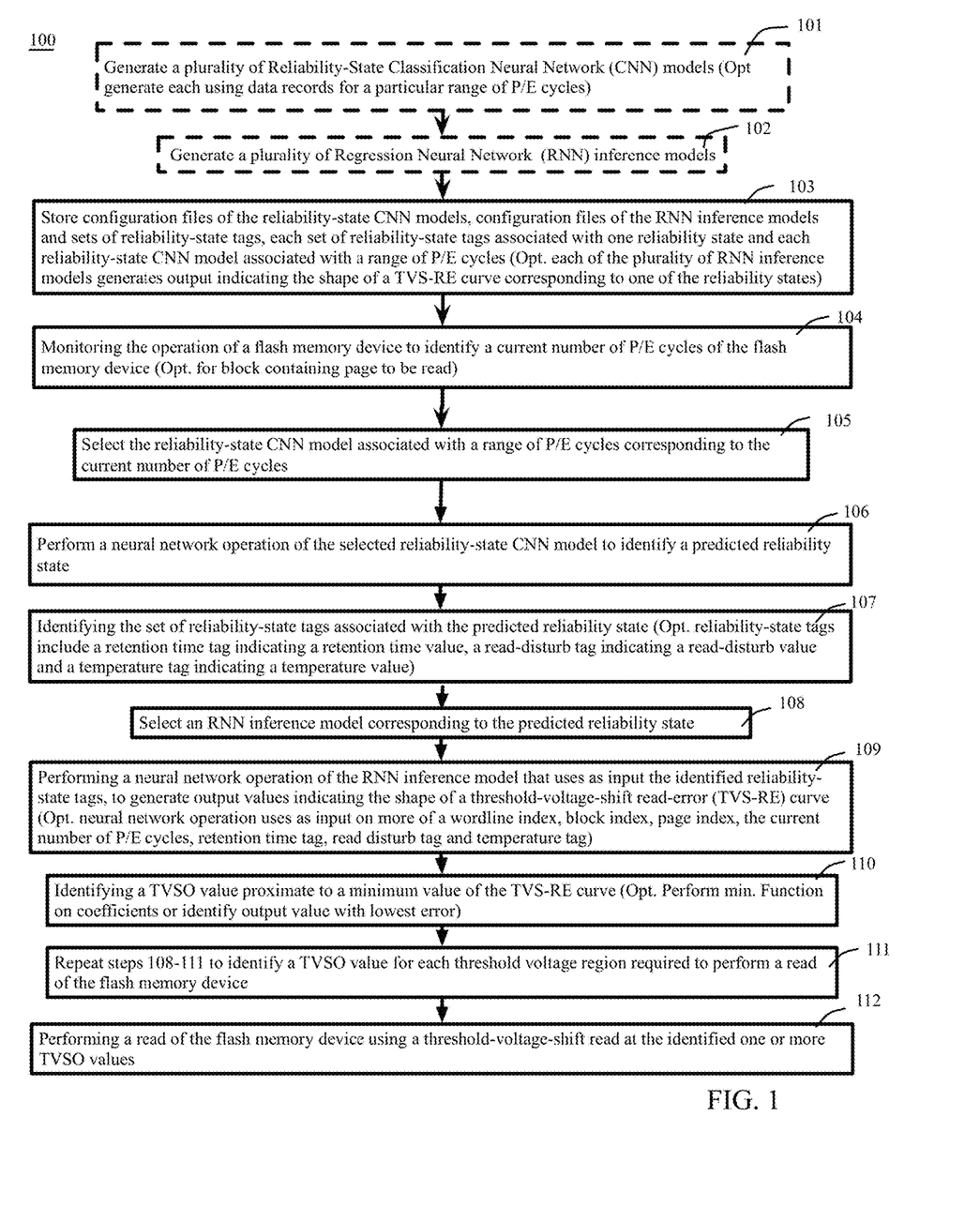
FIG. 1 is a diagram illustrating method for performing a read of a flash memory device.

FIG. 1 illustrates a method 100 for reading a flash memory device that includes generating (101) a plurality of reliability-state CNN models. The term "reliability-state CNN model," as used in the present application, includes all CNN models configured to predict a reliability state. In one example, the reliability-state CNN model is generated as shown in US Non-Provisional patent application Ser. No. 17/213,675 filed on Mar. 26, 2021 that is titled "Method and Apparatus for Determining when Actual Wear of a Flash Memory Device Differs from Reliability States for the Flash Memory Device", that is incorporated by reference herein in its entirety. Representative flash memory devices are tested to identify the number of errors that occur as the representative flash memory devices age. The representative flash memory devices are devices that are similar to, or identical to, the flash memory devices that are to be read using method 100. In one example, representative flash memory devices are inserted into test fixtures of a testing computer system and testing is performed to identify a number of flash characterization testing errors (FCT-ERROR values) for each wordline for each of a plurality of cycling conditions, where each cycling condition corresponds to a particular reliability state.

In the following examples TVSO values are indicated using the format "TVSOn", where n indicates the threshold voltage region specified by a manufacturer of the flash memory device. More particularly, first TVSO region values ($TVSO_1$) indicate a TVSO value for reading a first threshold voltage region, second TVSO region values ($TVSO_2$) indicate a TVSO value for reading a second threshold voltage region, third TVSO region values ($TVSO_3$) indicate a TVSO value for reading a third threshold voltage region, fourth TVSO region values ($TVSO_4$) indicate a TVSO value for reading a fourth threshold voltage region, fifth TVSO region values ($TVSO_5$) indicate a TVSO value for reading a fifth threshold voltage region specified by a manufacturer of the flash memory, sixth TVSO region values ($TVSO_6$) indicate a TVSO value for reading a sixth threshold voltage region, seventh TVSO region values ($TVSO_7$) indicate a TVSO value for reading a seventh threshold voltage region, and so on. In one example a TVSO-region index is defined for each TVSO region, with the TVSO-region index for $TVSO_1$ having a value of 1, the TVSO-region index for $TVSO_2$ having a value of 2, the TVSO-region index for $TVSO_3$ having a value of 3 and so forth. Each voltage region is related to a read voltage threshold level, and thus in an SLC only a single region is provided, whereas in MLC a plurality of voltage regions are provided.

The TVSO value(s) that are used to perform reads to identify FCT-ERROR values will be referred to as Flash-Characterization-Read-Threshold-Voltage-Shift Offset (FCR-TVSO) values and may be represented in the form FCR-TVSO ($TVSO_1$) for a read of a SLC nonvolatile memory device, FCR-TVSO ($TVSO_1$, $TVSO_2$, $TVSO_3$) for a read of a MLC nonvolatile memory device, FCR-TVSO ($TVSO_1$, $TVSO_2$, $TVSO_3$, $TVSO_4$, $TVSO_5$, $TVSO_6$, $TVSO_7$) for a read of a TLC nonvolatile memory device; FCR-TVSO ($TVSO_1$, $TVSO_2$, $TVSO_3$, $TVSO_4$, $TVSO_5$, . . . $TVSO_{15}$) for a read of a TLC nonvolatile memory device, and FCR-TVSO ($TVSO_1$, $TVSO_2$, $TVSO_3$, $TVSO_4$, $TVSO_5$, . . . $TVS_{31}$) for a read of a PLC nonvolatile memory device. In one example, for SLC nonvolatile memory devices, reads of each wordline of the representative flash memory devices are performed by a "scanning operation" in which reads are performed at each TVSO value that the particular representative flash memory device is capable of being read. In one example, for non-SLC nonvolatile memory devices, reads of each wordline of the representative flash memory devices are performed by a "scanning operation" in which reads are performed at each TVSO value that the particular representative flash memory device is capable of being read at while setting the other TVSO regions to a value of zero (e.g., starting at the lowest TVSO value that the flash memory device is capable of reading at and incrementing by one after each read). Thus, each FCR-TVSO value will have a single $TVSO_n$ value that is nonzero and the other $TVSO_n$ values will have a value of 0.

Figure 2:
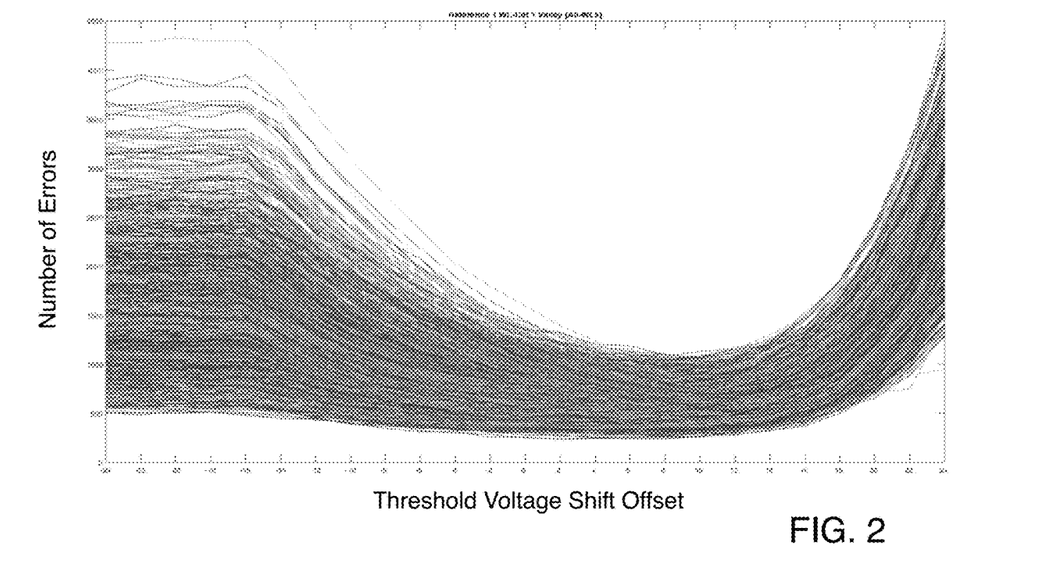
FIG. 2 is a graph illustrating exemplary threshold-voltage-shift read-error curves generated using the results from testing of representative flash memory devices in which the number of errors is shown on the y-axis and TVSO is shown on the x-axis.
Figure 3:
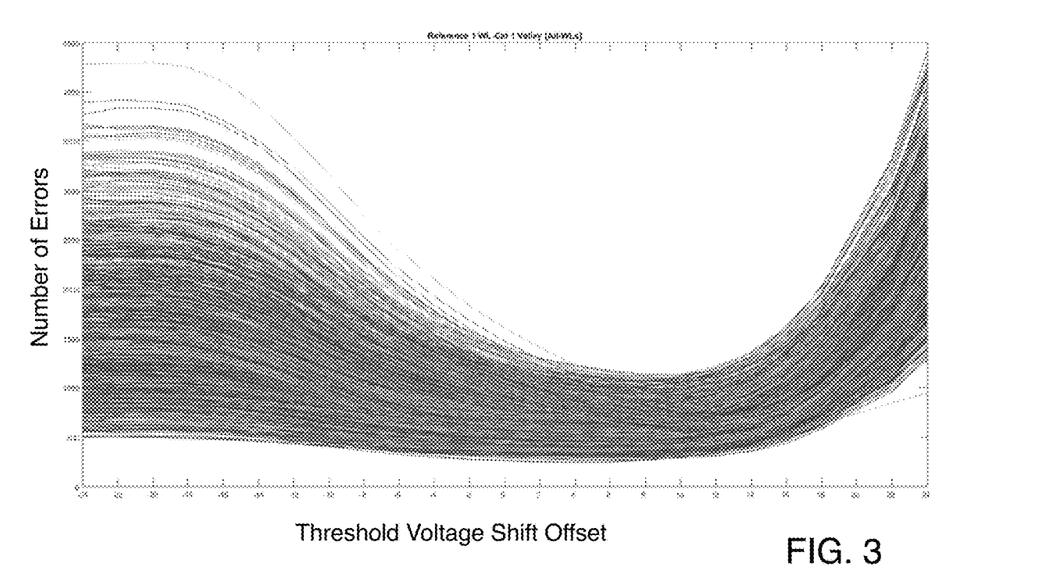
FIG. 3 is a graph illustrating exemplary smoothed threshold-voltage-shift read-error curves generated from the data set illustrated in FIG. 2, in which the number of errors is shown on the y-axis and TVSO is shown on the x-axis.

FIG. 2 shows an example of Threshold-Voltage-Shift Read-Error (TVS-RE) curves generated by scanning representative flash memory devices with TVSO values from −24 to +24, each TVS-RE curve identifying a number of errors as a function TVSO values at cycling conditions corresponding to one of the reliability states and corresponding to one of the threshold voltage regions required for reading the flash memory device As can be seen in FIG. 2, because of the nature of the flash read circuitry there are fluctuations (noise) in the number of errors of each curve. This noise may negatively impact the learning process while training the neural network model which may lead to errors in the neural network results. To avoid this problem a smoothing function (e.g., an algorithm such as a moving average or multipolynomial interpolation) is optionally applied to the testing results to generate a smoothed threshold-voltage-shift-read data set in which FCT-ERROR values are adjusted to obtain corresponding smoothed error values (ERROR). FIG. 3 shows an example of TVS-RE curves generated from smoothing the FCT-ERROR values of FIG. 2 to obtain ERROR values.

In one example, the testing and the smoothing generates data records that indicate one or more of the following values for each test (where each test corresponds to a single read): a wordline index value (WORDLINE INDEX) indicating the wordline that is tested, a block index value (BLOCK INDEX) indicating the block that is being tested, a page index value (PAGE INDEX) indicating the page that is being tested, a retention time value (RETENTION TIME) indicating the retention time for the wordline that is being tested, a read disturb value (READ DISTURB) indicating a number of read disturbs for the wordline that is being tested, a temperature value (TEMPERATURE) indicating the cycling temperature for the representative flash memory device being tested, a P/E cycle value (P/E CYCLES) indicating the current number of P/E cycles for the wordline (or block) being tested and an error value (ERROR) indicating the number of errors in the read (as adjusted in the smoothing operation).

Figure 4A:
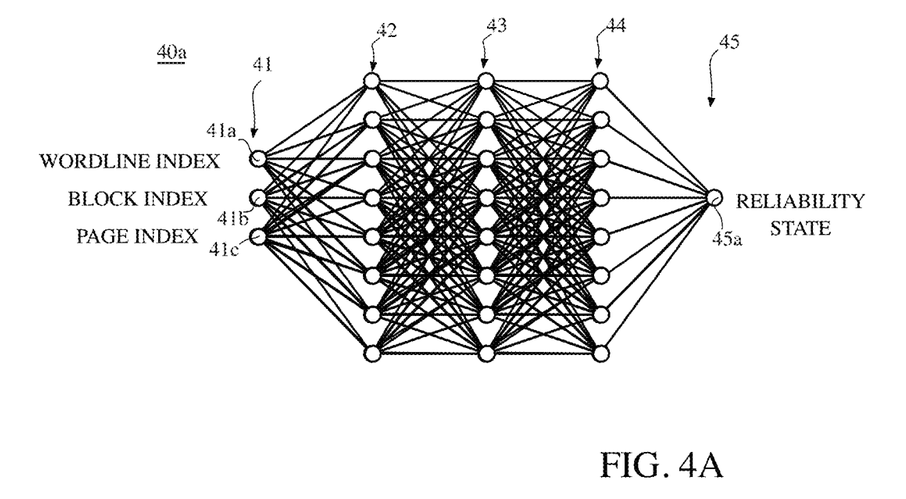
FIG. 4A-4B are block diagrams illustrating reliability-state CNN inference models.
Figure 4B:
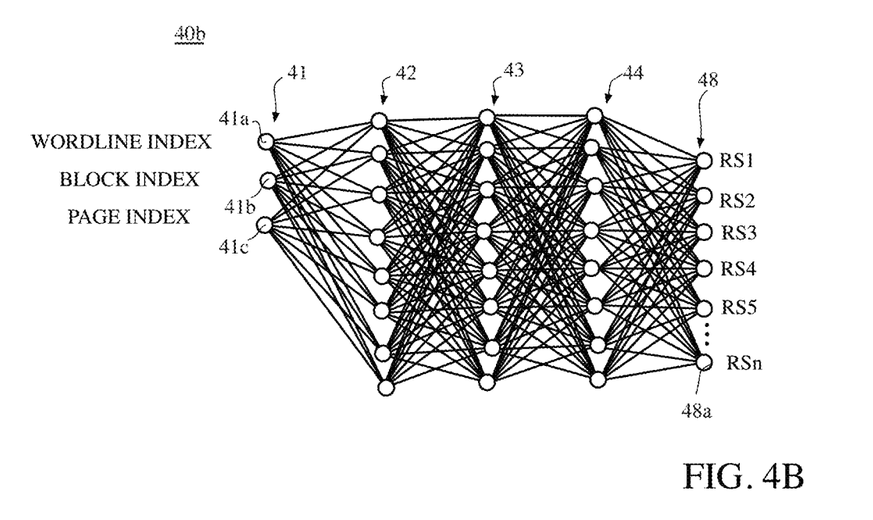

FIG. 4A-4B illustrate examples of reliability-state CNN models 40a-40b that may be generated in step 101. It is appreciated that reliability-state models 40a-40b are exemplary, and that many other combinations of inputs, outputs and hidden layers could be used. Reliability-state CNN models 40a, 40b include an input layer 41 that includes input neurons 41a-c and layers 42-44 of hidden neurons. Reliability-state CNN model 40a includes an output layer 45 that includes a single output neuron 45a that indicates a predicted reliability state. A predicted reliability state is the reliability state indicated by the output neurons when a neural network operation of the reliability-state CNN model is performed. Reliability-state CNN model 40b in FIG. 4B includes an output layer 48 that includes one output neuron 48a for each of a plurality of reliability states, denoted respectively RS1, RS2, RS3, RS4, RS5 . . . RSn. In this example the number of output neurons 48a is equal to the number of reliability states and each output neuron 48a indicates the probability that the reliability state represented by the particular output neuron is the correct reliability state, where the output neuron 48a having the highest numerical value indicates the predicted reliability state. In one example an activation function is applied to the output (e.g., a softmax activation function) to assure that the probabilities of the respective output neurons of output layer 48 sum to one.

Data records from the flash characterization testing are divided by f P/E cycle values and a plurality of reliability-state CNN models are formed, each valid for, and associated with, a particular range of P/E cycle values. More particularly, the training data files that are used for training each reliability-state CNN model include only those training data files for tests having a number of P/E cycles that is within the range of P/E cycle values of the particular reliability-state CNN model. In one example, training using training data files for tests performed within a first range of P/E cycle values (e.g., 0-1,000 P/E cycles) is used to create a first reliability-state CNN model, training using training data files for tests performed at a second range of P/E cycle values (e.g., 1001-2,000 P/E cycles) is used to create a second reliability-state CNN model. In one example, 7 P/E-categorized reliability-state CNN models are generated, including a third reliability-state CNN model (2,001 P/E cycles to 3,000 P/E cycles), a fourth reliability-state CNN model (3,001 P/E cycles to 4,000 P/E cycles), a fifth reliability-state CNN model (4,001 P/E cycles to 5,000 P/E cycles), a sixth reliability-state CNN model (5,001 P/E cycles to 6,000 P/E cycles) and a seventh reliability-state CNN model (6,001 P/E cycles to 7,000 P/E cycles), where 7,000 P/E cycles is considered end of life.

In one example, during training a WORDLINE INDEX is input to input neuron 41a, a BLOCK INDEX is input into neuron 41b and a PAGE INDEX is input into neuron 41c to train the respective CNN model 40a or 40b to recognize a particular reliability state. Thus, WORDLINE INDEX, BLOCK INDEX and PAGE INDEX are the features of the resulting reliability-state CNN model 40a or 40b. After training, each resulting reliability-state CNN model is tested to determine whether the resulting model can accurately predict the correct reliability state. When a model fails to accurately predict the correct class, training data records are removed and the training is repeated. The process of removing training data records and repeating training is performed until the resulting CNN models, taken together, accurately predict all reliability states.

When a model fails to accurately predict the correct reliability state, data records corresponding to scans of TVSO regions that are less responsive to a particular current physical characteristic can be selected for removal from the training data set. In one example of a TLC, the training data records corresponding to TVSO values required to read one or more of an upper page (e.g., $TVSO_1$, $TVSO_3$, $TVSO_5$ and $TVSO_7$), a middle page (e.g., $TVSO_2$ and $TVSO_6$) or a lower page (e.g., $TVSO_4$) are removed. For example, if it is known from the flash characterization testing that the upper page is more sensitive to retention and if the CNN model fails to accurately predict a reliability state in which retention is greater than zero, removal of records having nonzero TVSO values in threshold voltage regions corresponding to the lower and middle pages (e.g., $TVSO_2$, $TVSO_4$ and $TVSO_6$)

can produce better results. Thereby, data records for reads at threshold voltage regions that primarily add noise to the reliability-state CNN model are removed.

A plurality of RNN inference models are generated (102). Each RNN inference model is configured to identify the shape of a TVS-RE curve for one of the threshold voltage regions required to read a flash memory device, where each TVS-RE curve identifies a number of errors as a function of TVSO values. In one example, the RNN inference model is generated as shown in US Non-Provisional patent application Ser. No. 17/089,891, filed on Nov. 5, 2021, having the title "Regression Neural Network for Identifying Threshold Voltages to be Used in Reads of Flash Memory Devices", that is incorporated by reference herein in its entirety.

In step 102, for each reliability state, a RNN inference model is generated for each threshold voltage region required to read flash memory devices 2. Each RNN inference model generates output indicating the shape of a TVS-RE curve corresponding to one of the reliability states and corresponding to one of the threshold voltage regions required for reading each flash memory device 2.

Reliability states can be indicated using a numerical value that identifies each reliability state, referred to hereinafter as a Reliability State Index (RSI). In one example, an RSI of 1 identifies a first reliability state, an RSI of 2 identifies a second reliability state, and so forth.

In one example, each RNN model is associated with a corresponding TVSO-region index that indicates the threshold voltage region that the particular RNN inference model represents and is associated with a corresponding RSI. For example, when flash memory devices 2 are MLC devices, for a first reliability state a first RNN inference model is associated a TVSO-region index of 1 and an RSI of 1; a second RNN inference model is associated with a TVSO-region index of 2 and an RSI of 1; and a third RNN inference model is associated with a TVSO-region index of 3 and an RSI of 1.

Training can be performed using the same data records that were used to generate the reliability-state CNN models in step 101: however, in addition to using as features WORDLINE INDEX, BLOCK INDEX and PAGE INDEX, one or more of the following additional features are also used: RETENTION TIME, READ DISTURB, TEMPERATURE and P/E CYCLES.

Figure 5A:
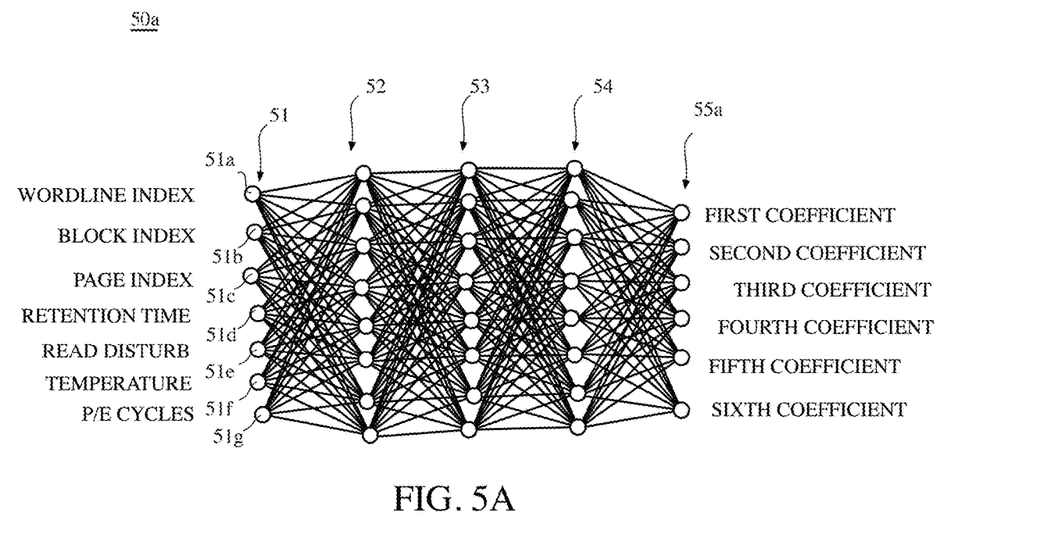
FIG. 5A-5B are block diagrams illustrating RNN inference models.

FIG. 5A shows a diagram of an exemplary RNN inference model 50a that includes a plurality of input neurons 51a-51g, a plurality of output neurons 55a and layers 52-54 of hidden neurons. In one example, during training WORDLINE INDEX is input to input neuron 51a, BLOCK INDEX is input into input neuron 51b, PAGE INDEX is input into input neuron 51c, RETENTION TIME is entered into input neuron 51d, READ DISTURB is entered into input neuron 51e, TEMPERATURE is entered into input neuron 51f and P/E CYCLES is input into input neuron 51g. Output neurons 55a generate output in the form of coefficient values that indicate the shape of (and thereby define) a TVS-RE curve for a particular threshold voltage region. The output of RNN inference model 50a is shown to include six coefficients, shown as FIRST COEFFICIENT, SECOND COEFFICIENT, THIRD COEFFICIENT, FOURTH COEFFICIENT, FIFTH COEFFICIENT and SIXTH COEFFICIENT. It is appreciated that the RNN inference model 50a can have any number of coefficients, and that the number of coefficients can be altered to achieve a balance between processing time and accuracy.

In one example, the coefficients indicate a straight line in the form $y=mx+q$, where m and q are the two coefficients. In other examples the line can be nonlinear and the coefficients can be in the form $y=a+bx+cx^2+cx^3+dx^4+ex^5$ where a, b, c, d and e are the coefficients (e.g., FIRST COEFFICIENT . . . SIXTH COEFFICIENT).

Figure 5B:
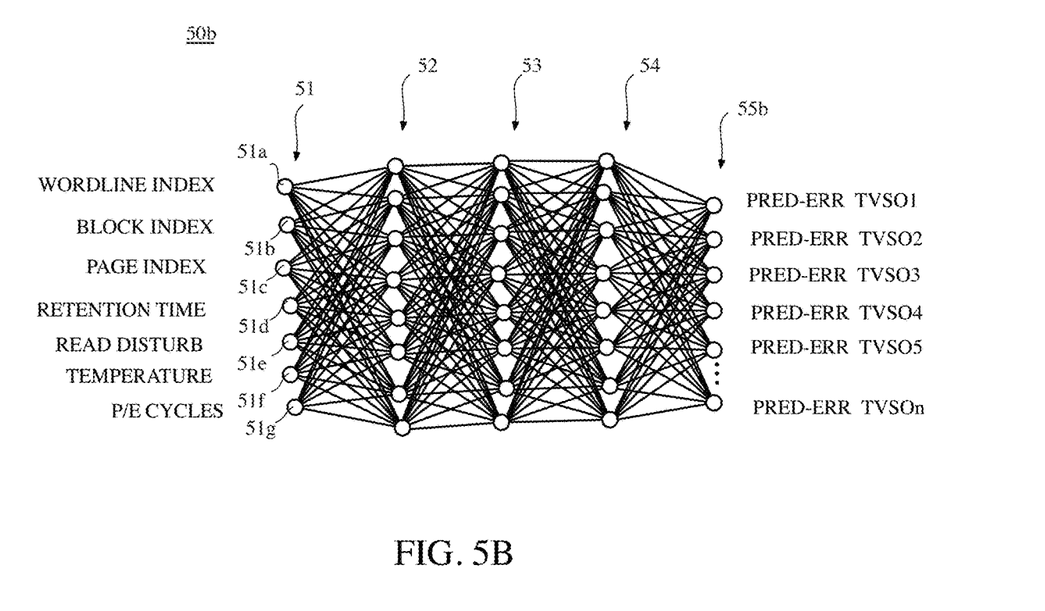

In the example shown in FIG. 5B, output neurons 55b generate values that indicate the number of errors at locations corresponding to TVSO values. In this example, output neurons 55b include an output neuron for each TVSO value (for n TVSO values), such as, for example an output neuron that predicts the error when a first TVSO value is used (PRED-ERR TVSO1), an output neuron that predicts the error when a second TVSO value is used (PRED-ERR TVSO2), an output neuron that predicts the error when a third TVSO value is used (PRED-ERR TVSO3), an output neuron that predicts the error when a fourth TVSO value is used (PRED-ERR TVSO4), an output neuron that predicts the error when a fifth TVSO value is used (PRED-ERR TVSO5) and so on, to an output neuron that predicts the error when an $n^{th}$ TVSO value is used (PRED-ERR TVSOn).

Exemplary neural network models shown in FIGS. 4A-5B include input neurons for receiving a PAGE INDEX, and PAGE INDEX is a feature used for the training of the neural network models shown in FIGS. 4A-5B. Alternatively, PAGE INDEX is not used as a feature during the training and each of the neural network models shown in FIGS. 4A-5B do not include input neurons 41c and 51c.

Figure 6:
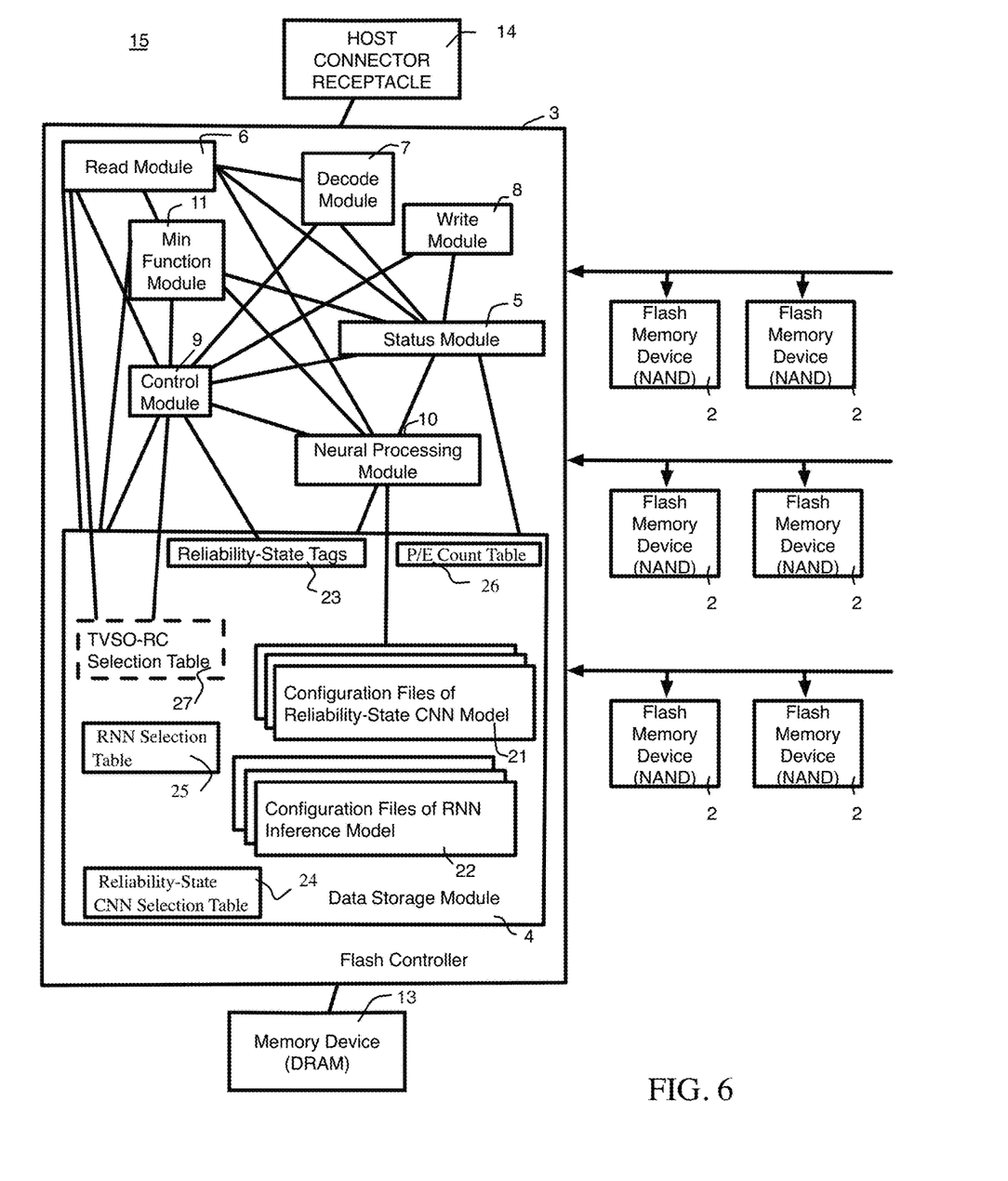
FIG. 6 is a block diagram illustrating an SSD.

An SSD 15 is shown in FIG. 6 to include a flash controller 3 coupled to a plurality of flash memory devices 2 for storing data. In the present embodiment, the flash memory devices 2 are NAND devices and SSD 15 includes one or more circuit boards onto which a host connector receptacle 14, flash controller 3 and flash memory devices 2 are attached. SSD 15 may also include one or more memory device 13 such as a Dynamic Random Access Memory (DRAM), that may be a separate integrated circuit device attached to the one or more circuit boards, and is electrically coupled to flash controller 3.

Flash controller 3 is configured to receive read and write instructions from a host computer through host connector receptacle 14, and to perform program operations, erase operations and read operations on memory cells of flash memory devices 2 to complete the instructions from the host computer. For example, upon receiving a write instruction from the host computer via host connector receptacle 14, flash controller 3 is operable to store data in SSD 15 by performing program operations (and when required, erase operations) to program codewords into on one or more of flash memory devices 2.

Flash controller 3 includes data storage module 4, status module 5, read module 6, decode module 7, write module 8, control module 9, neural processing module 10 and minimum function module 11. Control module 9 is coupled to data storage module 4, status module 5, read module 6, decode module 7, write module 8, minimum function module 11 and neural processing module 10. Decode module 7 is further coupled to read module band to status module 5. Status module 5 is further coupled to data storage module 4, read module 6, write module 8 and neural processing module 10. Read module 6 is further coupled to data storage module 4, neural procession module 10 and minimum function module 11. Minimum function module 11 is further coupled to data storage module 4, status module 5, control module 9 and neural processing module 10. Neural processing module 10 is further coupled to data storage module 4.

Data storage module 4 stores configuration files of Reliability-State CNN models 21, configuration files of RNN inference models 22, reliability-state tags 23 and optional TVSO-RC selection table 27. Optional TVSO-RC selection table 27 is coupled to read module 6. TVSO-RC selection table 27 includes one or more index and corresponding TVSO values to be used in performing reads (e.g., an index corresponding to a block, a wordline and/or a page, and index corresponding to a number of P/E cycles and TVSO values for each threshold voltage region required to perform a read).

One or more of the following are stored in SSD 15, either in data storage 4, flash memory devices 2 or in memory device 13: configuration files of Reliability-State CNN models 21, configuration files of RNN inference models 22, reliability-state tags 23, reliability-state CNN selection table 24 and RNN selection table 25, P/E count table 26 and optional TVSO-RC selection table 27. Neural processing module 10 is coupled to data storage module 4 such that configuration files of a reliability-State CNN model 21 and configuration files of an RNN inference model 22 can be loaded thereon.

In one example, neural processing module 10 includes a specialized hardware module (e.g., a specialized configurable accelerator) specifically configured to perform a neural network operation, sometimes referred to as a neural network engine (e.g., a programmable logic circuit). Alternatively, neural processing module 10 can include a processor and software for performing neural network operations. In one example, flash controller 3 is operable to perform steps 101-102 by receiving test data that indicates the results from testing representative flash memory devices and flash controller 3 is operable to construct the neural network models and associated configuration files in steps 101-102.

Flash controller 3 is an integrated circuit device and some or all of modules 5-11 include circuits that can be dedicated circuits for performing operations, and some or all of modules 5-11 can be firmware that includes instructions that are performed on one or more processor for performing operations of flash controller 3, with the instructions stored in registers of one or more of modules 5-11 and/or stored in data storage module 4 or memory device 13. Some of all of modules 5-11 include processors for performing instructions and instructions are loaded into flash controller 3 (e.g., through host connector receptacle 14) prior to operation of flash controller 3. In one example a firmware image is loaded into flash controller 3 (e.g., through host connector receptacle 14) prior to operation of flash controller 3, the firmware image including instructions to be performed by one or more of modules 5-11.

Flash memory devices 2 may be SLC, MLC, TLC QLC or PLC NAND devices. In the present embodiment flash memory devices 2 are capable of performing a wide range of threshold-voltage-shift reads, including reads specified by whole number TVSO values such as −n . . . −2, −1, 0, +1, +2 . . . n without limitation. Each flash memory device 2 may be a packaged semiconductor die or "chip" that is coupled to flash controller 3 by conductive pathways that couple instructions, data and other information between each flash memory device 2 and flash controller 3. Upon receiving a write instruction from a host computer, write module 8 is operable to encode received data into a codeword that is sent to a particular flash memory device 2 along with a corresponding program instruction. Flash memory device 2 is operable to perform the requested program instruction by programming cells of flash memory device 2. In one example, each flash memory device 2 includes NAND memory cells that are organized into blocks and pages, with each block composed of NAND strings that share the same group of wordlines. Each logical page is composed of cells belonging to the same wordline. The number of logical pages within each logical block is typically a multiple of 16 (e.g. 64, 128). In the present example, a logical page is the smallest addressable unit for reading from, and writing to, the NAND memory cells of each flash memory device 2 and a logical block is the smallest erasable unit. However, it is appreciated that programming less than an entire logical page may be possible, depending on the structure of the NAND array. Though flash memory devices 2 are illustrated as being NAND devices, it is appreciated that flash memory devices 2 may be any type of memory storage device that uses a threshold voltage for reading memory cells of the flash memory device 2.

Referring back to FIG. 1, configuration files of the reliability-state CNN models, configuration files of the RNN inference models and tags corresponding to each reliability state are stored (103), that are referred to hereinafter as "reliability-state tags." Data storage module 4 is configured for storing configuration files of reliability-state CNN models 21 generated in step 101, configuration files of RNN inference models 22 generated in step 102 and reliability-state tags 23 for each of the reliability states of reliability-state CNN models 21.

Reliability-state CNN models, RNN inference models and reliability-state tags 23 can be created using the same computing system that is used for performing testing of representative semiconductor devices, and then downloaded and installed into SSD 15 prior to delivery of SSD 15 to a customer. Alternatively, SSD 15 is operable to perform some or all of steps 101-102 to generate reliability-state tags 23 configuration files of reliability-state CNN models 21 and RNN inference models 22.

In one example, configurations files 21, 22 and reliability-state tags 23 are initially stored in memory device 13 and/or on one or more flash memory devices 2 and configuration files of reliability-state CNN models 21, configuration files of RNN inference models 22, and reliability-state tags 23 are loaded into data storage module 4 either upon start-up of flash controller 3 or when they are required for operations of flash controller 3.

The operation of a flash memory device 2 is monitored (104) to identify a current number of P/E cycles of the flash memory device 2. In one example, status module 5 is operable to monitor the operation of each flash memory device 2 to identify the number of P/E cycles of flash memory devices 2. The determined number of P/E cycles may be identified by a counter of status module 5, and at times the value of the counter may be stored (e.g., as a table) in data storage module 4, in flash memory devices 2 or in memory device 13 (e.g. stored in flash memory devices 2 on power-down or low power mode of flash controller 3 and/or SSD 15, and loaded into data storage module 4 and/or memory device 13 at startup or when required by flash controller 3). In one example the current number of P/E cycles for the block of the flash memory device to be read in step 112 is stored in P/E count table 26.

The reliability state CNN model corresponding to the current number of P/E cycles is selected (105). In one example, reliability-state CNN selection table 24 indicates a number of P/E cycles and corresponding values, or pointers, identifying the particular CNN model to be used. Status module 5 is operable to determine a current number of P/E cycles of the block containing the page that is to be read in step 112.

The reliability-state CNN model selected is the one of the stored reliability-state CNN models associated with (and that was trained using) the particular range of P/E cycle values that includes the current number of P/E cycles. For example, if the current number of P/E cycles is 500 and training records for tests of exemplary flash memory devices corresponding to a first range of P/E cycles (e.g., 0-1,000 P/E cycles) are used to create a first reliability-state CNN model, the first reliability-state CNN model is selected. In one example reliability-state CNN selection table 24 indicates a number of P/E cycles and a corresponding index identifying a location in memory where the configuration files of the respective reliability-state CNN model 21 is stored and a look-up operation is performed on reliability-state CNN selection table 24 using the current number of P/E cycles identified in step 104 to identify the location in memory where the identified reliability-state CNN model is stored).

A neural network operation of the selected reliability-state CNN is performed (106) to identify a predicted reliability state. In the example of FIG. 6, control module 9 is operable to load the configuration files of the selected reliability-state CNN model 21 into neural processing module 10 to form a reliability-state CNN core. Control module 9 or other circuitry of flash controller 3 couples the input (e.g., feature input vectors) required for the neural network operation to the reliability-state CNN core in neural processing module 10 and a neural network operation is performed by neural processing module 10 on the reliability-state CNN core.

In the examples shown in FIG. 4A, control module 9 is operable to receive the output from output neuron 45a and identify the predicted reliability state responsive thereto. In one example, a value of one output by output neuron 45a indicates a first reliability state, a value of 2 output by output neuron 45a indicates a second reliability state and so forth. In the examples shown in FIG. 4B, control module 9 is operable to receive the output from output neurons 48a and identify the predicted reliability state by identifying the reliability state corresponding to the output neuron 48a having the highest value.

Tags associated with the predicted reliability state are identified (107), that may be referred to as "reliability-state tags". In one example, reliability-state tags 23 are stored, either in the form individual tag values, comma separated values or in a tag lookup table that includes indexes corresponding to each reliability state and reliability-state tags associated with the particular reliability state. When reliability-state tags 23 are stored in a lookup table, the reliability-state tags associated with the predicted reliability state can be identified by performing a lookup operation using an index corresponding to the predicted reliability state (e.g., the RSI). For example, if the output of output neuron 45a is a value of 1, and if that corresponds to a first reliability state having a first set of reliability-state tags, the first set of reliability-state tags are identified in step 107. The identified reliability-state tags 23 can be coupled to neural processing module 10 and stored in input registers of neural processing module 10.

Reliability state tags 23 indicate the testing parameters corresponding to each reliability state. In one embodiment the reliability-state tags include a retention time tag (RTT) indicating a retention time value, a read disturb tag (RDT) indicating a read disturb value and a temperature tag (TT) indicating a temperature value.

In one example, retention time is divided into two ranges: 0-12 hours and 12-24 hours and the RTT for each reliability state is the midpoint between the two values. Read disturb is divided into two ranges: 0-100,000 disturbs and 100,000-200,000 disturbs and the RDT for each reliability state is the midpoint between the two values. Temperature is divided into two ranges 25-40 degrees Centigrade (C) and 40-70 degrees C. and the TT for each reliability state is the midpoint (rounded up to a whole number) between the two values. In this example, the following reliability-state tags will be stored for the first reliability-state CNN model (e.g., 0-1,000 P/E cycles), that correspond to a first of eight reliability states, where the last number following the arrow is the RSI that indicates the particular reliability state:

RTT=6 h, RDT=50 k, TT=33→0
RTT=6 h, RDT=50 k, TT=55→1
RTT=6 h, RDT=150 k, TT=33→2
RTT=6 h, RDT=150 k, TT=55→3
RTT=18 h, RDT=50 k, TT=33→4
RTT=18 h, RDT=50 k, TT=55→5
RTT=18 h, RDT=150 k, TT=33→6
RTT=18 h, RDT=150 k, TT=55→7

In this example, the second reliability-state CNN model (e.g., 1001-2,000 P/E cycles) is configured to identify one of eight reliability states (e.g., RSI 8-15) and will include the following eight sets of reliability-state tags:

RTT=6 h, RDT=50 k, TT=33→8
RTT=6 h, RDT=50 k, TT=55→9
RTT=6 h, RDT=150 k, TT=33→10
RTT=6 h, RDT=50 k, TT=55→11
RTT=18 h, RDT=50 k, TT=33→12
RTT=18 h, RDT=50 k, TT=55→13
RTT=18 h, RDT=150 k, TT=33→14
RTT=18 h, RDT=150 k, TT=55→15

Continuing with the above example: the third reliability-state CNN model (e.g., 2001-3,000 P/E cycles) is also configured to identify one of eight reliability states (e.g., RSI 16-23) and includes eight corresponding sets of reliability-state tags; the fourth reliability-state CNN model (e.g., 3001-4,000 P/E cycles) is configured to identify one of eight reliability states (e.g., RSI 24-41) and includes another eight sets of reliability-state tags; the fifth reliability-state CNN model (e.g., 4001-5,000 P/E cycles) is configured to identify one of eight reliability states (e.g., RSI 32-39) and includes eight more sets of reliability-state tags; the sixth reliability-state CNN model (e.g., 5001-6,000 P/E cycles) is configured to identify one of eight reliability states (e.g., RSI 40-47) and will include an additional eight sets of reliability-state tags; and the seventh reliability-state CNN model (e.g., 6001-7,000 P/E cycles) is configured to identify one of eight reliability states (e.g., RSI 48-56).

An RNN inference model is selected (108) that corresponds to the predicted reliability state and one of the TVSO regions required to read flash memory device 2. In FIG. 6, an RNN selection table 25 stored in data storage 4 includes values corresponding to each of the reliability states, values corresponding to each TVSO region required to read each flash memory device 2 (e.g., a TVSO-region index) and corresponding values, or pointers, identifying the particular RNN inference model to be used. In one example, a lookup operation is performed on RNN selection table 25 using a value corresponding to the predicted reliability state and a TVSO region index of "1" to identify the RNN inference model to use for predicting the shape of the first threshold voltage region (TVSO$_1$). In one example RNN selection table 25 includes values corresponding to reliability states and TVSO region indexes, and corresponding indexes identifying the location in data storage module 4 where the each RNN inference model is stored, and a lookup operation in RNN selection table 25 is performed using as input the output at output neuron 45a and a TVSO region index to identify the location in memory where the corresponding RNN inference model is stored. In the embodiment shown in FIG. 4B a value corresponding to the output neuron 48a having the highest value (e/g., an RSI) is input into RNN selection table 25 to identify the location in memory where the corresponding RNN inference model is stored.

A neural network operation of the stored RNN inference model is performed (109) to generate output indicating the shape of a TVS-RE curve. More particularly, a neural network operation of the RNN inference model selected in step 108 is performed. The input for the neural network operation includes the identified reliability-state tags 23 associated with the predicted reliability state.

Control module 9 or other circuitry of flash controller 3 is operable to load the configuration files of the selected RNN inference model 22 into neural processing module 10 to form an RNN inference core. Control module 9 or other circuitry of flash controller 3 couples the input required for the neural network operation to the RNN inference core in neural processing module 10. The input, that may be referred to as a "feature vector" specifies the values to be applied to the input neurons in the neural network operation. In the example shown in FIGS. 5A and 5B the input for the RNN inference model 50a (an input feature vector) includes one or more input corresponding to the page that is to be read, such as a WORDLINE INDEX indicating the page that is to be read in step 112 (that is entered into input neuron 51a), a BLOCK INDEX indicating the block that is to be read in step 112 (that is entered into input neuron 51b) and a PAGE INDEX that indicates the page that is to be read in step 112 (that is entered into input neuron 51c). The input also includes the reliability-state tags identified in step 107, including an RTT that is entered into input neuron 51d, an RDT that is entered into input neuron 51e, a TT that is entered into input neuron 51f. The current number of P/E cycles (for the page being read in step 112) that was identified in step 104, is entered into input neuron 51g. A neural network operation is performed by neural processing module 10 on the loaded RNN inference core to indicate the shape of a TVS-RE curve corresponding to the identified current reliability-state tags 23.

Output neurons 55a generate output in the form of coefficient values that indicate the shape of a TVS-RE curve. The exemplary output of RNN inference model 50a is shown to include six coefficients, shown as FIRST COEFFICIENT, SECOND COEFFICIENT, THIRD COEFFICIENT, FOURTH COEFFICIENT, FIFTH COEFFICIENT and SIXTH COEFFICIENT. It is appreciated that the RNN inference model 50a may have any number of coefficients, and that the number of coefficients may be altered to achieve a balance between processing time and accuracy. In the example shown in FIG. 5B, output neurons 55b generate values that indicate the number of errors at locations corresponding to TVSO values, thereby indicating the shape of a TVSO-RE curve.

A TVSO value is identified (110) proximate to a minimum value of the generated TVS-RE curve. In one example, minimum function module 11 is configured to determine a minimum value for the generated TVS-RE curve and to identify a TVSO value proximate to the determined minimum value. It is appreciated that the identified "minimum value" will not be the exact minimum value as the minimum function module 11 may not have sufficient accuracy to identify the exact minimum. Accordingly, the minimum function module 11 will identify a TVSO value proximate the minimum value. Minimum function module 11 can include software, hardware and/or firmware for receiving the coefficients of the generated TVS-RE curve, identifying a minimum point of the curve and outputting the TVSO value corresponding to the identified minimum point of the curve. When output neurons 55a generate output in the form of coefficients as shown in FIG. 5A, minimum function module 11 includes an algorithm for identifying where the minimum value is (e.g., where on the x-axis) and that identifies the TVSO value that is proximate to the identified minimum point on the curve (e.g., the closest whole number TVSO value to the identified minimum point on the curve). When RNN model 55b is used, each output neuron 55b outputs a value that indicates the magnitude of the number of errors at locations corresponding to TVSO values. This indicates the shape of the TVS-RE curve. It is not necessary to identify the minimum point in the curve, since each output neuron 55b indicates predicted error when using a particular TVSO value and minimum function module 11 only needs to identify which output neuron 55b generates the lowest output (the lowest predicted error) to determine the TVSO value corresponding to the minimum value of the TVS-RE curve since it is known which TVSO value corresponds to each output neuron.

The process of steps 108-110 is repeated (111) to identify a TVSO value for each TVSO region required to read the flash memory device, that may be referred to as TVSO-RC values. Thus, multiple neural network operations will be performed (each performed using a different selected RNN inference model) with all of the neural network operations using the same feature vector (a feature vector having the WORDLINE INDEX, BLOCK INDEX and PAGE INDEX to be read, and the RTT, RDT and TT of the particular identified reliability state) for each TVSO region required to read the flash memory device.

A read of the flash memory device is then performed (112) using a threshold-voltage-shift read at the identified TVSO-RC values) identified in step 110. In one example, steps 104-112 are performed each time that a read instruction is received from a host computer, in response to receiving the read instruction. More particularly, in response to receiving a read instruction at host connector receptacle 14, steps 105-111 are performed so as to identify TVSO-RC values and read module 6 uses the TVSO-RC values identified in steps 105-111 to perform the read of step 112. In the present example the number of P/E cycles identified in step 104 is the number of P/E cycles of a particular location that is to be read in step 112 and can be the number or P/E cycles of the block containing the wordline that is to be read in step 112.

It has been found that the accuracy of the read of step 112 can be improved (and the number of read errors reduced) by performing (121) a read (flash-test read) at predetermined TVSO values (TEST-READ-TVSO VALUES), and identifying the number of errors (122) in the flash-test-read, that may be referred to as the current-read error (CR-ERROR). In this optional example, the neural network operation of step 106 uses as input CR-ERROR and the TEST-READ-TVSO VALUES.

In one embodiment the process of steps 104-112, are performed periodically to generate sets of TVSO-RC values that are stored in optional TVSO-RC selection table 27. TVSO-RC selection table 27 includes one or more index corresponding to each set of TVSO-RC values (where each set includes the TVSO-RC values required to perform a read). In this example, when the read of step 112 is to be performed the one or more index is used to look up the corresponding TVSO values to use in the read (e.g., using the wordline index, block index, page index and current number of P/E cycles for the page that is to be read). It is appreciated that only the number of P/E cycles is required in addition to the values identifying the wordline/block/page to be read, and that retention time, read disturb and temperature for flash memory devices 2 need not be tracked or used for the lookup since the input vectors for each neural network operation include the associated tags instead of actual current calculated values as are used in prior art processes.

Since the input into the neural network model for read-disturb, retention time and cycling temperature are reliability-state tags that are stored (e.g., reliability-state tags 23) and the stored values of the tags do not change as the flash memory devices 2 age, there is no need to count and maintain a persistent table indicating the number of reads of each block or wordline, no need to count and maintain a persistent table indicating retention time for each block or wordline and no need to identify and maintain a persistent table indicating temperature cycling for each block or wordline.

The method and apparatus of the present invention models multiple factors that affect LIBER and indicates the shape of a TVS-RE curve that accurately reflects the physical characteristics of the location that is to be read, both the structural characteristics of the location that is to be read (e.g., the wordline and the block that is to be read), the current age/physical degradation of the location that is to be read (e.g., the number of P/E cycles) and the current transitory characteristics of the location that is to be read (e.g., closed-block read disturb and closed-block retention time). Accordingly, the generated TVSO values corresponding to the minimum value of the TVS-RE curve will be the appropriate TVSO value for performing the read.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What is claimed is:

1. A method for reading a flash memory device comprising:
storing configuration files of a plurality of reliability-state classification neural network (CNN) models, configuration files of a plurality of regression neural network (RNN) inference models and a plurality of sets of reliability-state tags, each set of reliability-state tags associated with one of a plurality of reliability states and each of the reliability-state CNN models associated with a range of program and erase (P/E) cycles;
monitoring the operation of the flash memory device to identify a current number of P/E cycles of the flash memory device;
selecting one of the reliability-state CNN models associated with a range of P/E cycles corresponding to the current number of P/E cycles;
performing, at a flash controller, a neural network operation of the selected reliability-state CNN model to identify a predicted reliability state;
identifying the set of reliability-state tags associated with the predicted reliability state;
selecting the one of the plurality of RNN inference models that corresponds to the predicted reliability state;
performing, at a flash controller, a neural network operation of the selected RNN inference model, that uses as input the identified reliability-state tags, to generate output values indicating the shape of a threshold-voltage-shift read-error (TVS-RE) curve;
identifying a threshold voltage shift offset (TVSO) value proximate to a minimum value of the TVS-RE curve;
repeating the selecting one of the RNN models, the performing of the neural network operation of the selected RNN inference model and the identifying to identify TVSO values for all threshold voltage regions required to read the flash memory device; and
performing a read of the flash memory device using a threshold-voltage-shift read at the identified TVSO values.

2. The method of claim 1 wherein the set of reliability-state tags associated with the predicted reliability state include a retention time tag indicating a retention time value, a read-disturb tag indicating a read-disturb value and a temperature tag indicating a temperature value.

3. The method of claim 1 wherein the performing a neural network operation of the identified reliability-state CNN model to identify a predicted reliability state uses as input to the neural network operation a wordline index and a block index.

4. The method of claim 1 wherein the performing a neural network operation of the identified reliability-state CNN model uses as input to the neural network operation a wordline index, a block index and a page index.

5. The method of claim 1 wherein the performing a network operation of the selected RNN inference model uses as input to the neural network operation a wordline index, a block index, a page index, a retention time tag, a read-disturb tag and a temperature tag.

6. The method of claim 1 wherein the output indicating the shape of the TVS-RE curve comprises a plurality of coefficients of the TVS-RE curve and wherein the identifying one or more TVSO values proximate to a minimum value of the generated TVS-RE curve comprises performing a minimum function on the coefficients to identify the TVSO value.

7. The method of claim 1 wherein the output indicating the shape of the TVS-RE curve comprises output values indicating the error corresponding to different TVSO values and wherein the identifying a TVSO value proximate to a minimum value of the generated TVS-RE curve comprises identifying the output value having the lowest error.

8. The method of claim 1 further comprising:
generating the plurality of RNN inference models, each of the RNN inference models for performing a regression neural network operation to identify coefficients of the TVS-RE curve.

9. The method of claim 1 further comprising:
generating the plurality of reliability-state CNN models, each of the plurality of reliability-state CNN models generated using data records corresponding to a different range of P/E cycle values.

10. A flash controller comprising:
a data storage module for storing configuration files of a plurality of reliability-state Classification Neural Network (CNN) models, configuration files of a plurality of Regression Neural Network (RNN) inference models and a plurality of sets of reliability-state tags, each set of reliability-state tags associated with one of a plurality of reliability states and each of the reliability-state CNN models associated with a range of program and erase (P/E) cycles;

a status module identify a current number of P/E cycles;

a neural processing module coupled to the data storage module and to the control module, the neural processing module to:

perform a neural network operation of the one of the stored reliability-state CNN models associated with a range of P/E cycles corresponding to the current number of P/E cycles to identify a predicted reliability state, and perform neural network operations of the RNN inference models corresponding to the predicted reliability state, using as input to each neural network operation the set of reliability-state tags associated with the predicted reliability state, to generate output indicating the shape of TVS-RE curves for all threshold voltage regions required to read a flash memory device;

a minimum function module identify TVSO values for all threshold voltage regions required to read the flash memory device, each of the identified TVSO values proximate a minimum value of one of the TVS-RE curves; and a read module to perform a read of the flash memory device by sending a threshold-voltage-shift read instruction to the flash memory device that includes the identified TVSO values.

11. The flash controller of claim 10 wherein the input for the neural network operation of the reliability-state CNN and the input for the neural network operation of the stored RNN inference model include a wordline index and a block index.

12. The flash controller of claim 10 wherein the input for the neural network operation of the reliability-state CNN and the input for the neural network operation of the stored RNN inference model include a wordline index, a block index and a page index.

13. The flash controller of claim 10 wherein the input for the neural network operation of the RNN inference model includes a wordline index, a block index, a page index, a retention time tag, a read-disturb tag and a temperature tag.

14. A Solid State Drive (SSD) comprising:

a flash memory device;

a flash controller coupled to the flash memory device, the flash controller including:

a data storage module storing configuration files of a plurality of reliability-state classification neural network (CNN) models, configuration files of a plurality of regression neural network (RNN) inference models and a plurality of sets of reliability-state tags, each set of reliability-state tags associated with one of a plurality of reliability states and each of the reliability-state CNN models associated with a range of program and erase (P/E) cycles;

a status module to identify a current number of P/E cycles;

a neural processing module coupled to the data storage module and to the control module, the neural processing module to:

perform a neural network operation of the one of the stored reliability-state CNN models associated with a range of P/E cycles corresponding to the current number of P/E cycles to identify a predicted reliability state, and perform neural network operations of the RNN inference models corresponding to the predicted reliability state, using as input to each neural network operation the set of reliability-state tags associated with the predicted reliability state, to generate output indicating the shape of TVS-RE curves for all threshold voltage regions required to read the flash memory device;

a minimum function module identify TVSO values for all threshold voltage regions required to read the flash memory device, each of the identified TVSO values proximate a minimum value of one of the TVS-RE curves; and a read module to perform a read of the flash memory device by sending a threshold-voltage-shift read instruction to the flash memory device that includes the identified TVSO values.

15. The SSD of claim 14 wherein the input for the neural network operation of the reliability-state CNN and the input for the neural network operation of the stored RNN inference model include a wordline index and a block index.

16. The SSD of claim 14 wherein the input for the neural network operation of the reliability-state CNN and the input for the neural network operation of the stored RNN inference model include a wordline index, a block index and a page index.

17. The SSD of claim 14 wherein the input for the neural network operation of the RNN inference model includes a wordline index, a block index, a page index, a retention time tag, a read-disturb tag and a temperature tag.

* * * * *

UNITED STATES PATENT AND TRADEMARK OFFICE
CERTIFICATE OF CORRECTION

PATENT NO. : 11,514,992 B2
APPLICATION NO. : 17/234993
DATED : November 29, 2022
INVENTOR(S) : Lorenzo Zuolo and Rino Micheloni It is certified that error appears in the above-identified patent and that said Letters Patent is hereby corrected as shown below:

In the Specification

Column 2, Line 12, "LIBER" should read --UBER--
Column 8, Line 57, "band" should read --6 and--
Column 12, Line 10, "33" should read --33C--
Column 12, Line 11, "55" should read --55C--
Column 12, Line 12, "33" should read --33C--
Column 12, Line 13, "55" should read --55C--
Column 12, Line 14, "33" should read --33C--
Column 12, Line 15, "55" should read --55C--
Column 12, Line 16, "33" should read --33C--
Column 12, Line 17, "55" should read --55C--
Column 12, Line 22, "33" should read --33C--
Column 12, Line 23, "55" should read --55C--
Column 12, Line 24, "33" should read --33C--
Column 12, Line 25, "55" should read --55C--
Column 12, Line 26, "33" should read --33C--
Column 12, Line 27, "55" should read --55C--
Column 12, Line 28, "33" should read --33C--
Column 12, Line 29, "55" should read --55C--

In the Claims

Claim 1, Column 16, Line 4, "a flash controller" should read --the flash controller--
Claim 10, Column 17, Line 4, "identify" should read --to identify--
Claim 10, Column 17, Line 21, "identify" should read --to identify--
Claim 14, Column 17, Line 48, "storing" should read --for storing--
Claim 14, Column 18, Line 26, "identify" should read --to identify--

Signed and Sealed this
Twenty-first Day of February, 2023

Katherine Kelly Vidal
*Director of the United States Patent and Trademark Office*